(12) United States Patent
Cheng et al.

(10) Patent No.: US 11,761,112 B2
(45) Date of Patent: Sep. 19, 2023

(54) METHOD FOR PREPARING LARGE-SIZE TWO-DIMENSIONAL LAYERED METAL THIOPHOSPHATE CRYSTAL

(71) Applicant: East China Jiaotong University, Nanchang (CN)

(72) Inventors: Ziqiang Cheng, Nanchang (CN); Haiquan Shi, Nanchang (CN); Xin Luo, Nanchang (CN); Jianpeng Liu, Nanchang (CN); Xun Wang, Nanchang (CN); Kelin Huang, Nanchang (CN)

(73) Assignee: EAST CHINA JIAOTONG UNIVERSITY, Nanchang (CN)

( * ) Notice: Subject to any disclaimer, the term of this patent is extended or adjusted under 35 U.S.C. 154(b) by 96 days.

(21) Appl. No.: 17/648,423

(22) Filed: Jan. 19, 2022

(65) Prior Publication Data

US 2023/0160091 A1    May 25, 2023

(30) Foreign Application Priority Data

Nov. 24, 2021   (CN) .......................... 202111398915.9

(51) Int. Cl.
  *C30B 9/00*    (2006.01)
  *C30B 29/14*    (2006.01)
  *C30B 29/46*    (2006.01)
  *C30B 29/64*    (2006.01)

(52) U.S. Cl.
  CPC ................ *C30B 9/00* (2013.01); *C30B 29/14* (2013.01); *C30B 29/46* (2013.01); *C30B 29/64* (2013.01)

(58) Field of Classification Search
  CPC ......... C30B 29/14; C30B 29/46; C30B 29/64; C30B 9/00
  See application file for complete search history.

(56) References Cited

PUBLICATIONS

Bang et al, "Dimensional reductions from 2-D Nb4P2S21 to 1-D ANb2PS10 (A=Na, K, Rb, Cs, Tl) and to 0-D Tl5[Nb2S4Cl8]Cl using halide molten salts," Journal of Solid State Chemistry, vol. 181, Issue 8, pp. 1798-1802 (Year: 2008).*

Chica et al., "P2S5 Reactive Flux Method for the Rapid Synthesis of Mono- and Bimetallic 2D Thiophosphates M2-xM'xP2S6", Inorganic Chemistry, 60 (6), p. 3502-3513 (Year: 2021).*

Choi et al, "Transition metal thiophosphates Nb4P2S21: New kind of 2D materials for multi-functional sensors," Journal of Alloys and Compounds, vol. 864, 158811, p. 1-6 (Year: 2021).*

* cited by examiner

*Primary Examiner* — Matthew J Song
(74) *Attorney, Agent, or Firm* — Bayramoglu Law Offices LLC

(57) ABSTRACT

A method for preparing a large-size two-dimensional layered metal thiophosphate crystal includes the following steps: 1) weighing raw materials of indium spheres, phosphorous lumps and sulfur granules according to a predetermined amount and proportion, mixing them, and using iodine as a transport agent and potassium iodide as a molten salt; 2) adding the raw materials, the iodine and the potassium iodide to a reaction vessel together, and vacuum sealing it under a certain pressure, and then subjecting it to a high-temperature reaction; 3) taking out the products after the reaction, and washing the products to remove the residual iodine and potassium iodide and obtain large-size two-dimensional layered metal thiophosphate crystals. This method is simple and highly efficient.

8 Claims, 8 Drawing Sheets

METHOD FOR PREPARING LARGE-SIZE TWO-DIMENSIONAL LAYERED METAL THIOPHOSPHATE CRYSTAL

CROSS REFERENCE TO THE RELATED APPLICATIONS

This application is based upon and claims priority to Chinese Patent Application No. 202111398915.9, filed on Nov. 24, 2021, the entire contents of which are incorporated herein by reference.

TECHNICAL FIELD

The present invention relates to the technical field of metal thiophosphate, in particular to a method for preparing a large-size two-dimensional layered metal thiophosphate crystal.

BACKGROUND

Since graphene was discovered in 2004, the researches on two-dimensional materials have developed rapidly, and many new two-dimensional materials have sprung up. The two-dimensional material family that has been discovered now covers the fields of insulators, semiconductors, conductors, and superconductors. The special structure and quantum restriction effect of the two-dimensional materials endow them many excellent physical and chemical properties that are unavailable in macroscopic bulk materials, such as high electron mobility, broadband absorption, ultra-fast response, electrical tunability, large specific surface area, compatibility in heterogeneous integration, and they have broad application prospects in the fields of electronic devices, optoelectronic devices, new energy, catalysis, biomedicine, etc. The large-scale controllable preparation of high-quality large-size two-dimensional materials is a prerequisite for the development of the wide application thereof, as well as an international frontier topic and a hot spot of research in the field of material science.

Metal thiophosphite is a kind of inorganic compound in a two-dimensional layered structure, which was discovered at the end of the 19$^{th}$ century. Along with the continuous in-depth researches on two-dimensional materials, two-dimensional metal thiophosphorous acid compound materials have once again attracted the wide attention of researchers and are now widely applied in the fields of photodetectors, catalysis, transistors, high-performance ferroelectric memories, sensors, energy, etc. At present, there are few reports on two-dimensional layered metal indium thiophosphate ($In_2P_3S_9$), and large-size two-dimensional layered metal indium thiophosphate ($In_2P_3S_9$) has not been reported.

SUMMARY

The present invention aims to provide a method for preparing a large-size layered metal thiophosphate crystal, so as to fill up the gap in the method for preparing large-size two-dimensional layered metal indium thiophosphates.

In order to realize the above purpose, the present invention provides a method for preparing a large-size two-dimensional layered metal thiophosphate crystal, comprising the following steps:

1) weighing raw materials including indium spheres, phosphorous lumps and sulfur granules according to a predetermined amount and a predetermined molar ratio, mixing the raw materials, and using iodine as a transport agent and potassium iodide as a molten salt;
2) adding the raw materials, the iodine and the potassium iodide to a reaction vessel together, and vacuum sealing the reaction vessel under a predetermined pressure, and then subjecting the reaction vessel to a high-temperature reaction;
3) taking out the products after the high-temperature reaction, and washing the products to remove residuals of the iodine and the potassium iodide from the products and obtain the large-size two-dimensional layered metal thiophosphate crystals.

Preferably, in step 1, the predetermined molar ratio of the raw materials of the indium spheres, the phosphorous lumps and the sulfur granules is 2:3:9.

Preferably, in step 1, according to a volume of the reaction vessel, an amount of the iodine is 1-3 mg/mL.

Preferably, in step 2, the predetermined pressure is less than $10^{-4}$ mbar.

Preferably, step 2 comprises the steps of after vacuum sealing, placing the reaction vessel horizontally in a two-zone furnace fix the high-temperature reaction, wherein the two-zone furnace comprises a high-temperature zone and a low-temperature zone; and placing the reaction vessel containing raw materials in the high-temperature zone.

Preferably, in step 2, a temperature of the high temperature zone is 600-700° C., a temperature of the low-temperature zone is 550-650° C., and a temperature difference between the high-temperature zone and the low-temperature zone is not less than 20° C.

Preferably, in step 2, the high-temperature reaction lasts for 2-5 days.

Preferably, in step 3, the products are washed with ultra-pure water and acetone.

The method for preparing a large-size two-dimensional layered metal thiophosphate crystal described in the present invention can complete the preparation of a large-size two-dimensional layered metal thiophosphate by using indium spheres, phosphorous lumps, sulfur granules, iodine and potassium iodide through a high-temperature reaction, and the size of the prepared two-dimensional layered metal thiophosphate can reach a magnitude of centimeter. The method has the advantages of simple operation and high efficiency. The prepared two-dimensional layered metal thiophosphate can be used in producing high-purity semiconductors, insulating materials, photoelectric functional materials, nonlinear optical materials, catalysts, etc., without restrictions on its application.

Below presents preferred embodiments of the present invention based on the drawings in order to illustrate the technical schemes of the present invention in detail.

DETAILED DESCRIPTION OF THE EMBODIMENTS

Below presents preferred embodiments based on the drawings in order to illustrate the technical schemes of the present invention in detail.

A method for preparing a large-size two-dimensional layered metal thiophosphate crystal comprises the following steps:
1) weighing raw materials including indium spheres, phosphorous lumps and sulfur granules according to a predetermined amount and a predetermined molar ratio, mixing the raw materials, and using iodine as a transport agent and potassium iodide as a molten salt. The predetermined molar ratio of the raw materials of the indium spheres, the phosphorous lumps and the sulfur granules is 2:3:9. According to a volume of the reaction vessel, an amount of the iodine is 1-3 mg/mL, that is, 1-3 mL of iodine shall be added in the reaction vessel per milliliter.
2) adding the raw materials, the iodine and the potassium iodide to a reaction vessel together, and vacuum sealing the reaction vessel under a predetermined pressure, and then subjecting the reaction vessel to a high-temperature reaction. The predetermined pressure is less than $10^{-4}$ mbar. After vacuum sealing, the reaction vessel is placed horizontally in a two-zone furnace for the high-temperature reaction, wherein the two-zone furnace comprises a high-temperature zone and a low-temperature zone; and the reaction vessel containing raw materials are placed in the high-temperature zone. The proportion of the length of the quartz tube in the high-temperature zone to that in the low-temperature zone is 4:6. A temperature of the high temperature zone is 600-700° C., a temperature of the low-temperature zone is 550-650° C., and a temperature difference between the high-temperature zone and the low-temperature zone is not less than 20° C.; the reaction lasts for 2-5 days.
3) taking out the products after the high-temperature reaction, and washing the products to remove residuals of the iodine and the potassium iodide from the products and obtain the large-size two-dimensional layered metal thiophosphate crystals. The products after the reaction are washed with ultrapure water and acetone.

Embodiment 1

Figure 1:
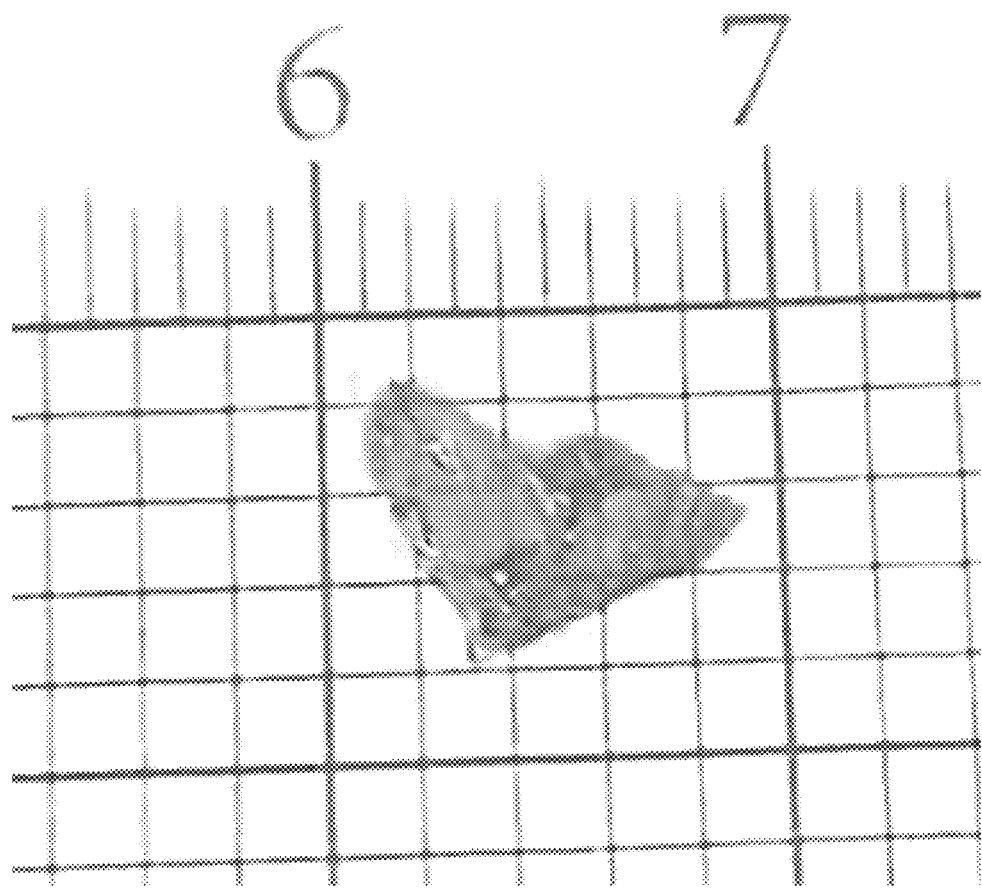
FIG. 1 is the photomacrograph of the single crystal in Embodiment 1 of the method for preparing a large-size two-dimensional layered metal thiophosphate crystal described in the present invention.
Figure 2:
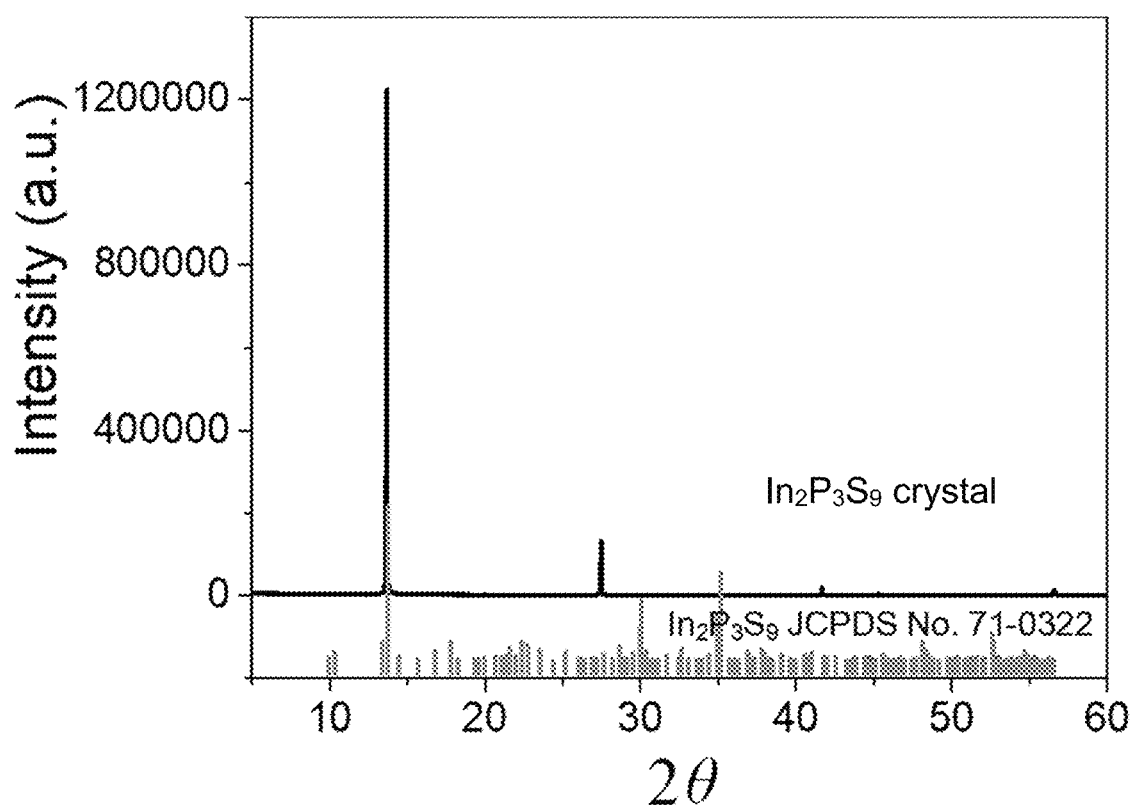
FIG. 2 is the X-ray diffraction pattern of the single crystal in Embodiment 1 of the method for preparing a large-size two-dimensional layered metal thiophosphate crystal described in the present invention.
Figure 3:
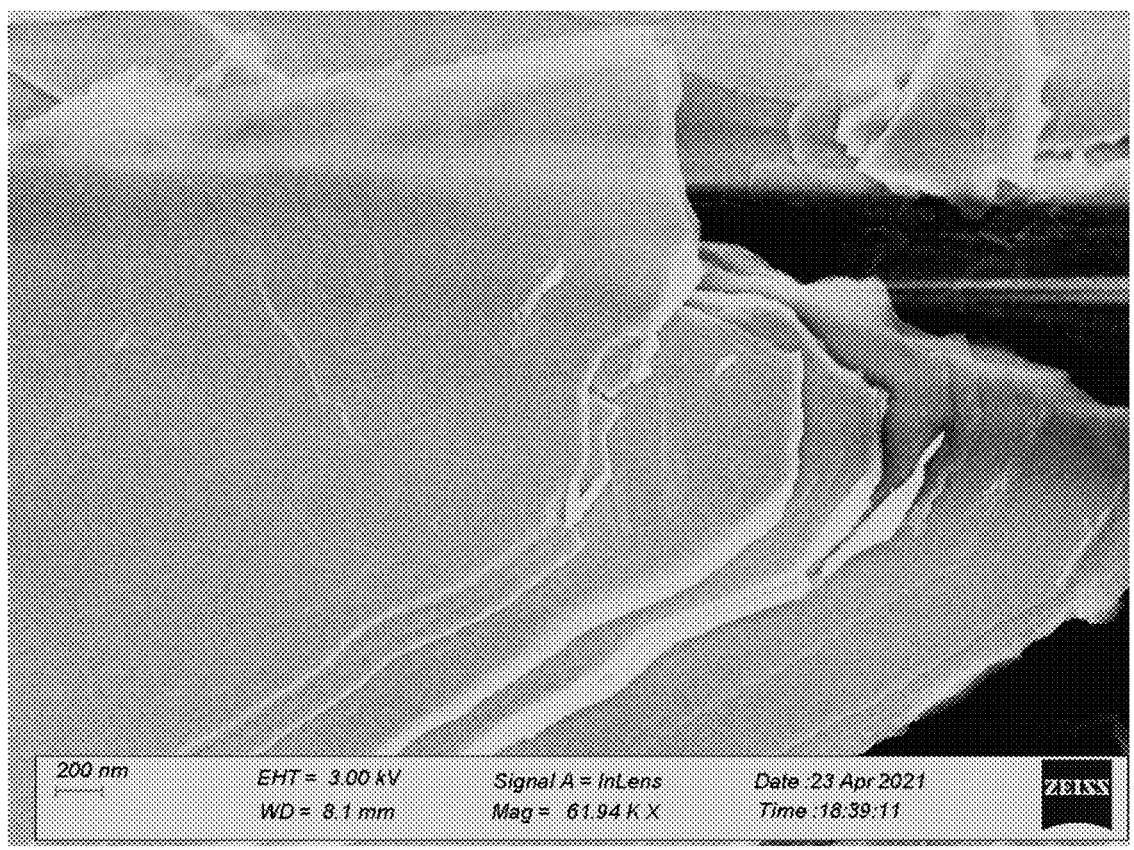
FIG. 3 is the picture of the single crystal in Embodiment 1 of the method for preparing a large-size two-dimensional layered metal thiophosphate crystal described in the present invention under a scanning electronic microscope.

574 mg of indium spheres, 232.5 mg of red phosphorous lumps, 72.0 mg of sulfur granules, 600 mg of potassium iodide and 30 mg of iodide were vacuum sealed together in a quartz tube. The pressure in the quartz tube was less than $10^{-4}$ mbar. It was placed in a tube furnace with double temperature zones to react for 3 days, with a temperature of 700° C. in the high-temperature zone and a temperature of 650° C. in the low-temperature zone. Upon completion of the reaction, it was cooled down to the room temperature, the residual iodine was removed by washing with acetone and potassium iodide was removed by washing with ultrapure water to obtain a single crystal of a centimeter magnitude. As shown in FIG. 1, the size of the single crystal reached a centimeter magnitude, and the crystal was yellow. As shown in FIG. 2, the X-ray diffraction pattern showed that the obtained crystal was the metal thiophosphate. As shown in FIG. 3, the picture of the crystal under the scanning electron microscope showed that the obtained single crystal is a layered material.

Embodiment 2

Figure 4:
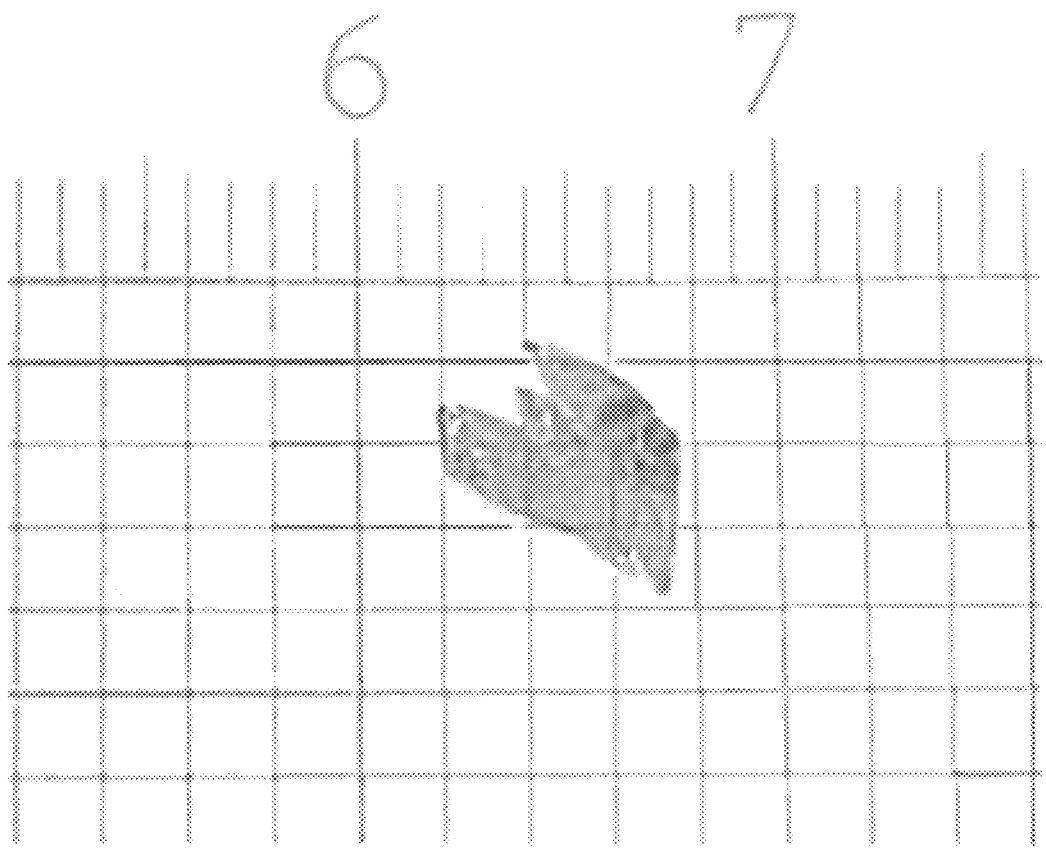
FIG. 4 is the macrophotograph of the single crystal in Embodiment 2 of the method for preparing a large-size two-dimensional layered metal thiophosphate crystal described in the present invention.

574 mg of indium spheres, 232.5 mg of red phosphorous lumps, 720 mg of sulfur granules, 600 mg of potassium iodide and 30 mg of iodide were vacuum sealed together in a quartz tube. The pressure in the quartz tube was less than $10^{-4}$ mbar. It was placed in a tube furnace with double temperature zones to react for 3 days, with a temperature of 650° C. in the high-temperature zone and a temperature of 600° C. in the low-temperature zone. Upon completion of the reaction, it was cooled down to the room temperature, the residual iodine was removed by washing with acetone and the residual potassium iodide was removed by washing with ultrapure water to obtain a single crystal of metal indium thiophosphate of a centimeter magnitude. As shown in FIG. 4, the size of the single crystal reached a centimeter magnitude, and the crystal was yellow.

Figure 5:
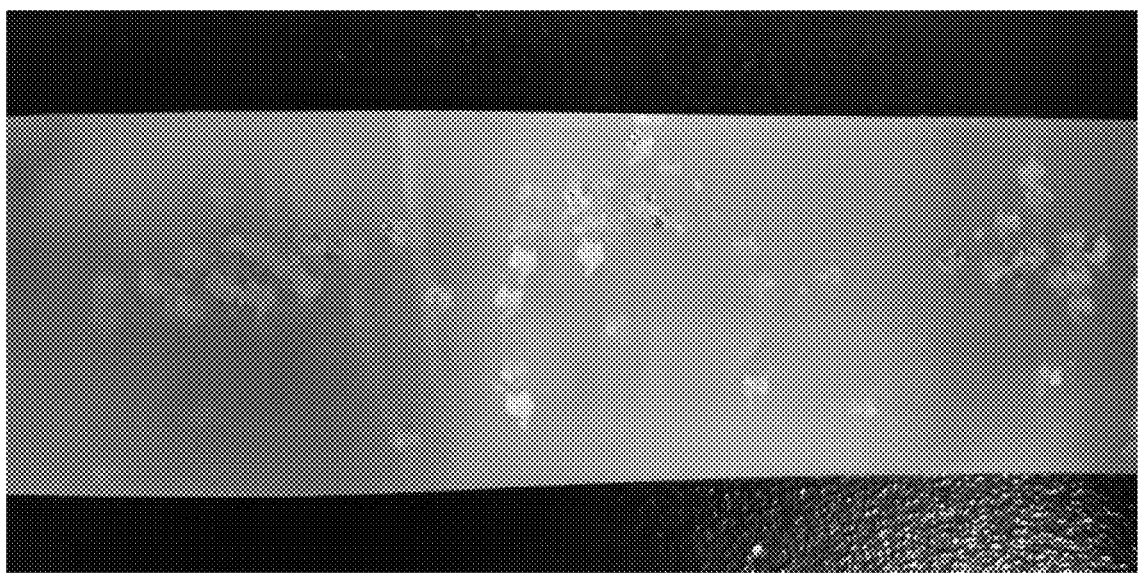
FIG. 5 is the picture of mechanical stripping of the single crystal in an embodiment of the method for preparing a large-size two-dimensional layered metal thiophosphate crystal described in the present invention.
Figure 6:
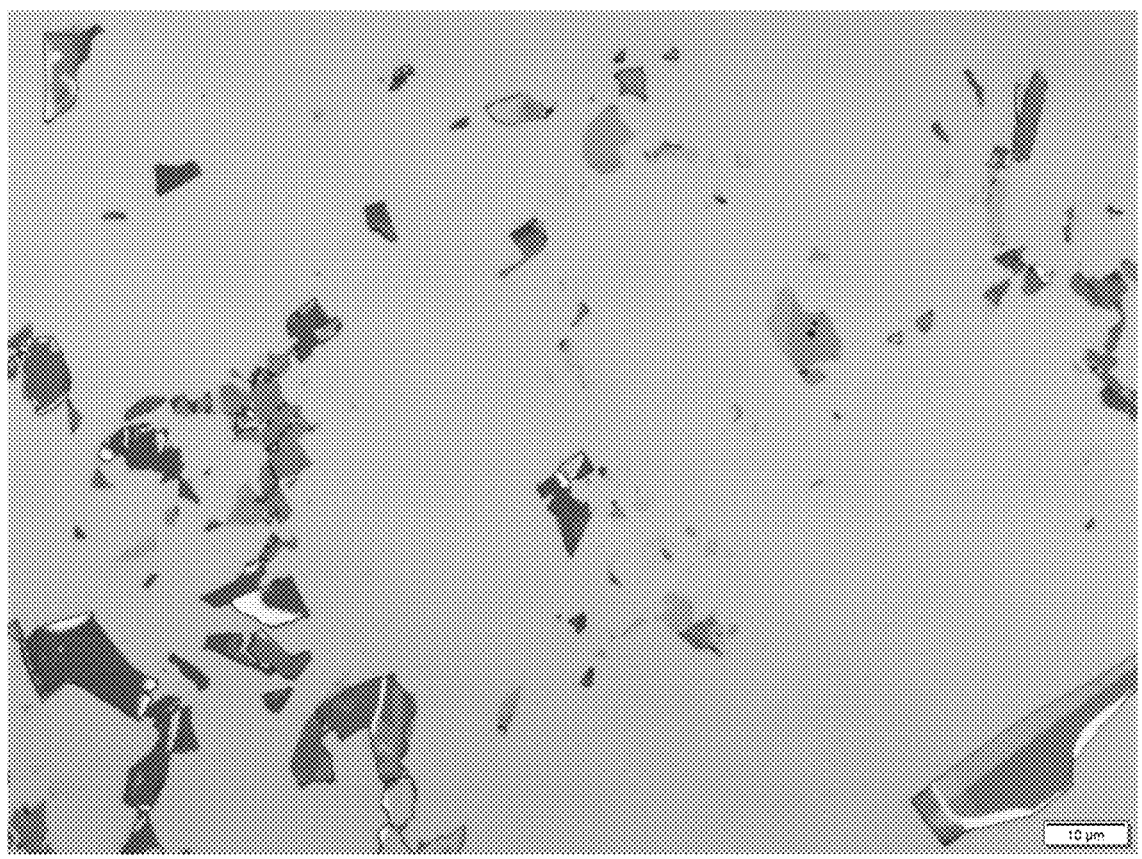
FIG. 6 is the picture of two-dimensional slices of metal indium thiophosphate in an embodiment of the method for preparing a large-size two-dimensional layered metal thiophosphate crystal described in the present invention under an optical microscope.

The single crystal of metal indium thiophosphate prepared by the method described in Embodiment 1 or Embodiment 2 was placed on a 3M tape, the obtained single crystal of metal indium thiophosphate could be torn in the two-dimensional slices by the 3M tape through mechanical stripping, and the slices were then transferred to a clean silicon wafer. As shown in FIG. 5, the single crystal of metal indium thiophosphate could be stripped into two-dimensional slices, which proved that the single crystal of metal indium thiophosphate was in a layered structure. The better the light transmittance of the slices under an optical microscope, the thinner the slices were. As shown in FIG. 6, the slices of metal indium thiophosphate in the middle had quite good light transmittance, and it could be seen that the single crystal of metal indium thiophosphate was able to be stripped into thin two-dimensional slices.

Comparative Embodiment 1

Figure 7:
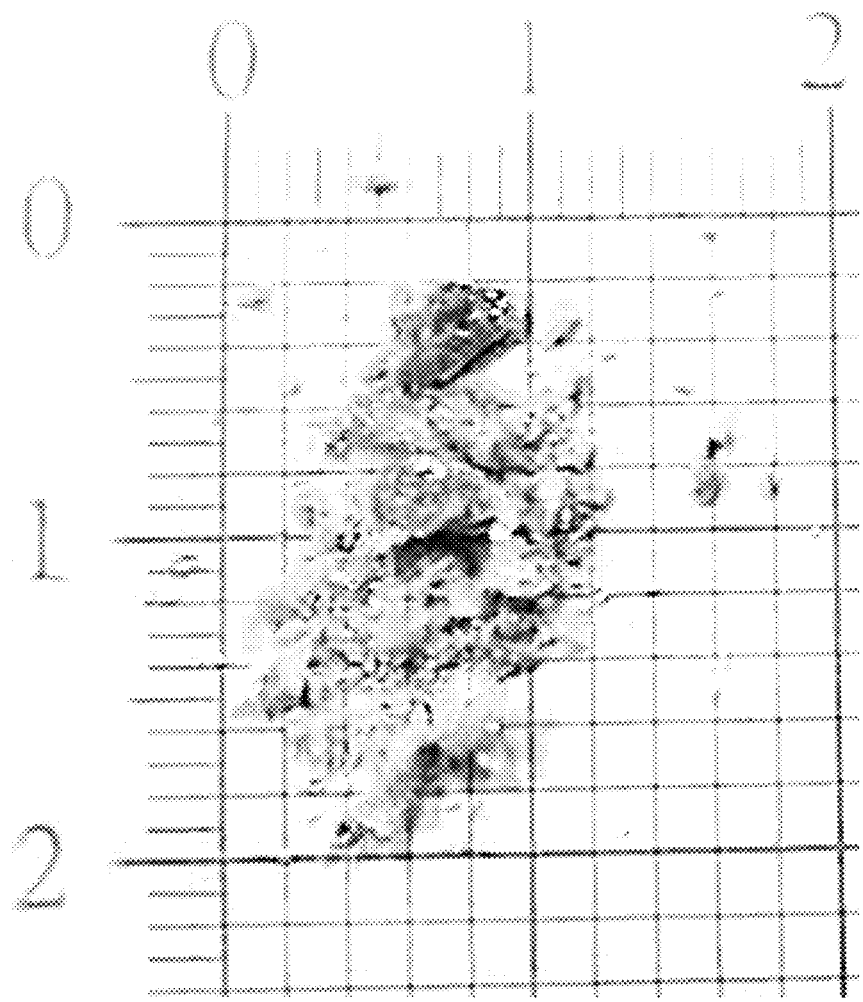
FIG. 7 is the photomacrograph of the single crystal in Comparative Embodiment 1 of the method for preparing a large-size two-dimensional layered metal thiophosphate crystal described in the present invention.
Figure 8:
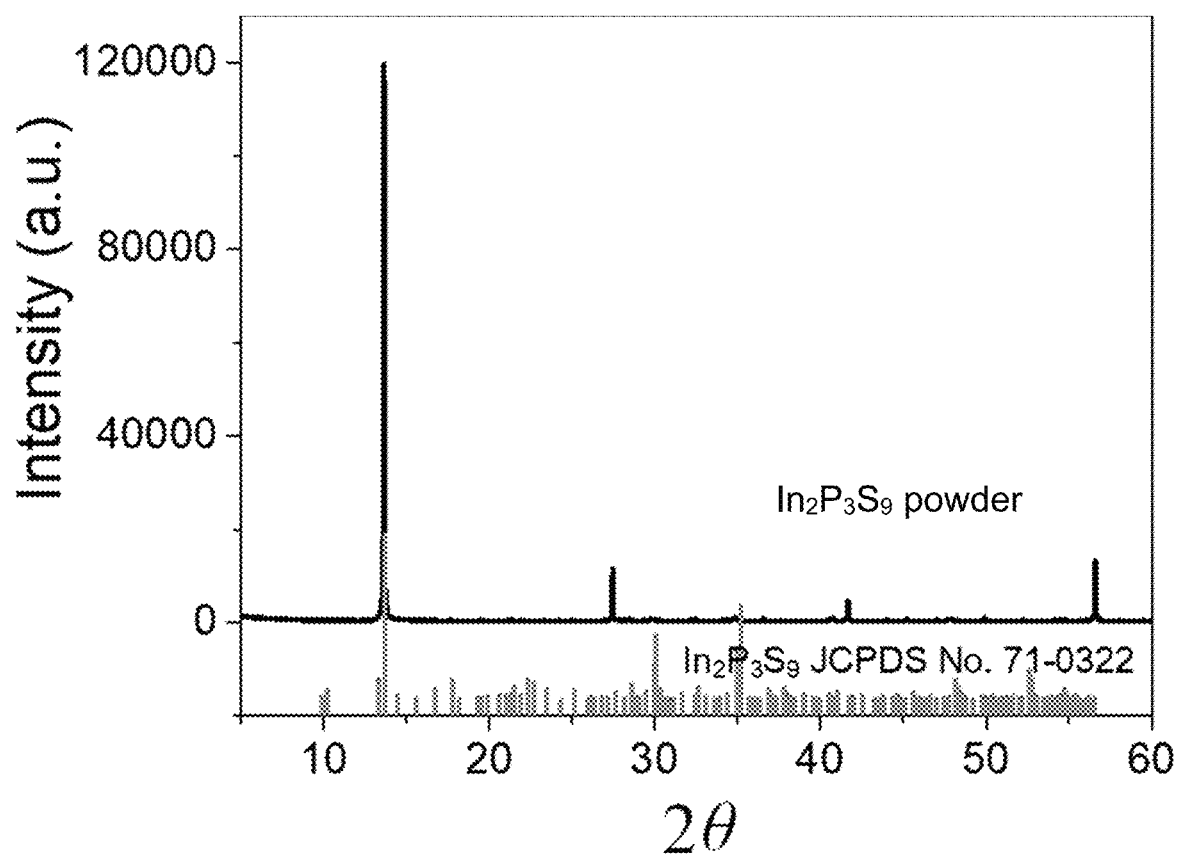
FIG. 8 is the X-ray diffraction pattern of the single crystal in Comparative Embodiment 1 of the method for preparing a large-size two-dimensional layered metal thiophosphate crystal described in the present invention.
Figure 9:
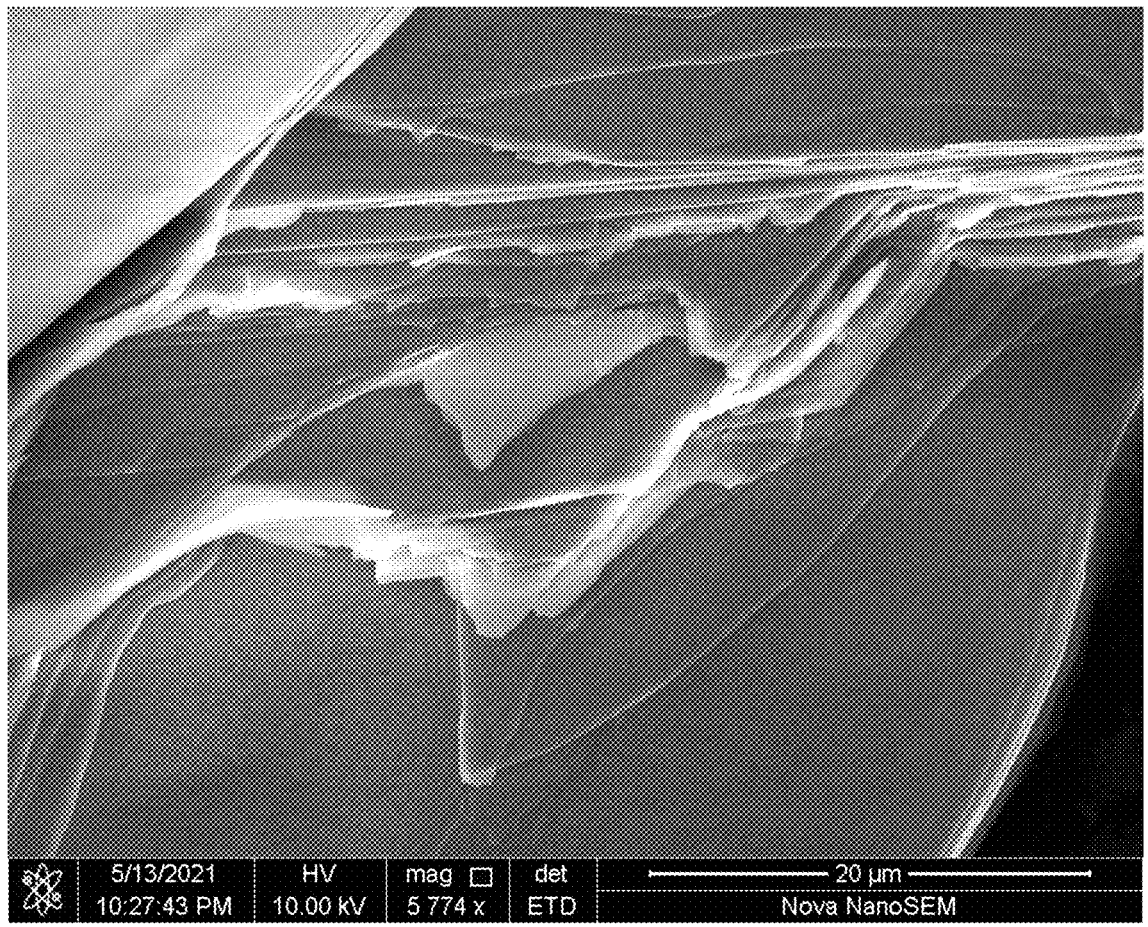
FIG. 9 is the picture of the single-crystal in Comparative Embodiment 1 of the method for preparing a large-size two-dimensional layered metal thiophosphate crystal described in the present invention under a scanning electronic microscope.

574 mg of indium spheres, 232.5 mg of red phosphorous lumps, 72.0 mg of sulfur granules and 30 mg of iodide were vacuum sealed together in a quartz tube. The pressure in the quartz tube was less than $10^{-4}$ mbar. It was placed in a tube furnace with double temperature zones to react for 3 days, with a temperature of 700° C. in the high-temperature zone and a temperature of 650° C. in the low-temperature zone. On completion of the reaction, it was cooled down to the room temperature, the residual iodine was removed by washing with acetone to obtain crystal powder. The crystal in FIG. 7 was yellow. As shown in FIG. 8, the X-ray diffraction pattern showed that the obtained crystal was metal thiophosphate. As shown in FIG. 9, the picture of the crystal under the scanning electron microscope showed that the obtained powered crystal was a layered material.

By comparing Embodiment 1 with Comparative Embodiment 1, it could be seen that without potassium iodide, a large-size two-dimensional layered metal thiophosphate crystal could not be produced, and only crystal powder as layered material could be obtained.

Molten salt synthesis is an improved powder metallurgy technology. Potassium iodide used as a molten salt in the reaction process can control the reaction rate and improve the uniformity of the reaction, and thereby it can control the nucleation rate and growth rate of crystal materials. The high-temperature reaction can be divided into three processes, including sublimation, transport and deposition. As a transport agent, iodine forms a gaseous state during the heating process to form a partial pressure gradient. Owing to the partial pressure gradient, the raw materials are converted into the required materials and transported to the low temperature zone for deposition and growth. In case of excessive transport agents, it is easy to form iodine doping or form a part of iodide in the material. In case of insufficient transport agents, it will result in the low growth rate of the crystal material.

By comparing Embodiment 1 with Comparative Embodiment 2, it could be seen that in the high temperature reaction process, when the temperature in the high temperature zone was 600-700° C., the temperature in the low temperature zone was 650-550° C., and the temperature difference between the high temperature zone and the low temperature zone was 50° C., metal indium thiophosphate in a pure phase could be formed. The temperature in the high temperature zone (temperature for sublimation) was 600-700° C., the temperature in the low temperature zone (temperature for deposition) should be determined according to the reaction enthalpy. The growth of metal indium thiophosphate is an endothermic reaction, and the temperature of the zone where the solid raw materials are located shall be higher than that of the zone for deposition and growth, and part of the solid raw material shall be ensured to be sufficient for sublimation. When the reaction temperature is higher, the sublimation rate and reaction rate of the solid raw materials are faster, resulting in the faster growth rate of the crystal. Other intervals of reaction temperature are prone to produce other phases, such as phosphide or sulfide of indium, resulting in the impurity of the final product obtained.

Therefore, the present invention can prepare large-size layered metal indium thiophosphate crystals by using the above method for preparing a large-size two-dimensional layered metal thiophosphate crystal, and the method is simple and highly efficient.

Finally, it shall be stated that the embodiments above are only used for explaining, rather than restricting, the technical schemes of the present invention. Although the present invention is explained in detail referring to the preferred embodiments, those of skill in the art should be understood that the technical schemes of the present invention can be modified or equivalently replaced, where the modifications or equivalent replacements will not make the modified technical scheme deviate from the spirit and scope of the technical schemes of the present invention.

What is claimed is:

1. A method for preparing a two-dimensional layered metal thiophosphate crystal, comprising the following steps:
   1) Weighing raw materials comprising indium spheres, phosphorous lumps and sulfur granules according to a predetermined amount and a predetermined molar ratio, mixing the raw materials, and using iodine as a transport agent and potassium iodide as a molten salt;
   2) Adding the raw materials, the iodine and the potassium iodide to a reaction vessel together, and vacuum sealing the reaction vessel under a predetermined pressure, and then subjecting the reaction vessel to a high-temperature reaction, wherein the high-temperature reaction is 600-700° C.;
   3) Taking out products after the high-temperature reaction, and washing the products to remove residuals of the iodine and the potassium iodide from the products and obtain the two-dimensional layered metal thiophosphate crystal.

2. The method according to claim 1, wherein in step 1, the predetermined molar ratio of the raw materials of the indium spheres, the phosphorous lumps and the sulfur granules is 2:3:9.

3. The method according to claim 1, wherein in step 1, according to a volume of the reaction vessel, an amount of the iodine is 1-3 mg/mL.

4. The method according to claim 1, wherein in step 2, the predetermined pressure is less than $10^{-4}$ mbar.

5. The method according to claim 1, wherein step 2 comprises:
   after vacuum sealing, placing the reaction vessel horizontally in a two-zone furnace for the high-temperature reaction, wherein the two-zone furnace comprises a high-temperature zone and a low-temperature zone, and
   placing the reaction vessel containing the raw materials in the high-temperature zone.

6. The method according to claim 5, wherein in step 2, a temperature of the high temperature zone is 600-700° C., a temperature of the low-temperature zone is 550-650° C., and a temperature difference between the high-temperature zone and the low-temperature zone is not less than 20° C.

7. The method according to claim 1, wherein in step 2, the high-temperature reaction lasts for 2-5 days.

8. The method according to claim 1, wherein in step 3, the products are washed with ultrapure water and acetone.

* * * * *